United States Patent
Tojo et al.

(10) Patent No.: US 6,995,406 B2
(45) Date of Patent: Feb. 7, 2006

(54) MULTIBEAM SEMICONDUCTOR LASER, SEMICONDUCTOR LIGHT-EMITTING DEVICE AND SEMICONDUCTOR DEVICE

(76) Inventors: Tsuyoshi Tojo, c/o Sony Corporation, 7-35, Kitashinagawa 6-chome, Shinagawa-ku, Tokyo (JP); Yoshifumi Yabuki, c/o Sony Shiroishi Semiconductor INC., 3-53-2, Shiratori Shiroishi-shi, Miyagi (JP); Shinichi Ansai, c/o Sony Shiroishi Semiconductor INC., 3-53-2, Shiratori Shiroishi-shi, Miyagi (JP); Tomonori Hino, c/o Sony Corporation, 7-35, Kitashinagawa 6-chome, Shinagawa-ku, Tokyo (JP); Osamu Goto, c/o Sony Shiroishi Semiconductor INC., 3-53-2, Shiratori Shiroishi-shi, Miyagi (JP); Tsuyoshi Fujimoto, c/o Sony Corporation, 7-35, Kitashinagawa 6-chome, Shinagawa-ku, Tokyo (JP); Osamu Matsumoto, c/o Sony Shiroishi Semiconductor INC., 3-53-2, Shiratori Shiroishi-shi, Miyagi (JP); Motonobu Takeya, c/o Sony Corporation, 7-35, Kitashinagawa 6-chome, Shinagawa-ku, Tokyo (JP); Yoshio Oofuji, c/o Sony Corporation, 7-35, Kitashinagawa 6-chome, Shinakawa-ku, Tokyo (JP)

( * ) Notice: Subject to any disclaimer, the term of this patent is extended or adjusted under 35 U.S.C. 154(b) by 0 days.

(21) Appl. No.: 10/486,050
(22) PCT Filed: Jun. 6, 2003
(86) PCT No.: PCT/JP03/07193
§ 371 (c)(1), (2), (4) Date: Feb. 6, 2004
(87) PCT Pub. No.: WO03/105295
PCT Pub. Date: Dec. 18, 2003

(65) Prior Publication Data
US 2004/0206975 A1 Oct. 21, 2004

(30) Foreign Application Priority Data
Jun. 10, 2002 (JP) .............................. 2002-168945

(51) Int. Cl.
H01L 33/00 (2006.01)
(52) U.S. Cl. ..................................... 257/103; 257/102
(58) Field of Classification Search ................ 257/103, 257/102, 105, 257
See application file for complete search history.

(56) References Cited

U.S. PATENT DOCUMENTS
5,822,349 A 10/1998 Takaoka et al.
(Continued)

FOREIGN PATENT DOCUMENTS
EP 1 005 068 A2 5/2000
(Continued)

OTHER PUBLICATIONS

Tsuyoshi Tojo et al. "GaN-based High Power Blue-Violet Laser Diodes", IPAP Conference Series 1, (2000), pp. 878-882, proceedings of International Workshop on Nitride Semiconductors.
(Continued)

Primary Examiner—David Nelms
Assistant Examiner—Thinh T Nguyen
(74) Attorney, Agent, or Firm—Trexler, Bushnell, Giangiorgi, Blackstone & Marr Ltd.

(57) ABSTRACT

In a multi-beam semiconductor laser including nitride III–V compound semiconductor layers stacked on one surface of a substrate of sapphire or other material to form laser structures, and including a plurality of anode electrodes and a plurality of cathode electrodes formed on the nitride III–V compound semiconductor layers, one of the anode electrodes is formed to bridge over one of the cathode electrodes via an insulating film, and another anode electrode is formed to bridge over another of the cathode electrodes via an insulating film.

14 Claims, 8 Drawing Sheets

U.S. PATENT DOCUMENTS

| | | |
|---|---|---|
| 6,031,858 A | 2/2000 | Hatakoshi |
| 6,222,866 B1 | 4/2001 | Seko |
| 6,365,429 B1 | 4/2002 | Kneissel et al. |
| 6,444,998 B1 * | 9/2002 | Taniguchi et al. ............ 257/13 |
| 6,757,314 B2 * | 6/2004 | Kneissl et al. ................ 372/50 |
| 2001/0005025 A1 | 6/2001 | Shin et al. |
| 2002/0005523 A1 | 1/2002 | Taniguchi et al. |

FOREIGN PATENT DOCUMENTS

| | | |
|---|---|---|
| JP | 01260878 | 10/1989 |
| JP | 06-244496 A | 9/1994 |
| JP | 10-200204 A | 7/1998 |
| JP | 11-233893 A | 8/1999 |
| JP | 11274634 | 10/1999 |
| JP | 2000-222274 A | 1/2000 |
| JP | 2000022274 | 1/2000 |
| JP | 2000196197 | 7/2000 |
| JP | 2000-277863 A | 10/2000 |

OTHER PUBLICATIONS

Charles, P.M., "Intergratable, High Speed Buried Ridge DFB Lasers Fabricated on Semi-Insulating Substrates", Electronic Letters, Apr. 25, 1991, vol. 27, No. 9, pp. 700-02, GB.

Ash, R.M., "A High Speed Low Capacitance Laser Structure for Integration", Indium Phoshide and Related Materials, 1991, 3rd Intl Conf., Apr. 8, 1991, pp. 122-125, UK.

Morgan, R.A., "Two-Dimensional Matrix Addressed Vertical Cavity Top-Surface Emitting Laser Array Display", IEEE Photonics Tech Ltrs, Aug. 1, 1994, vol. 6, No. 8, pp. 913-917, NY.

* cited by examiner

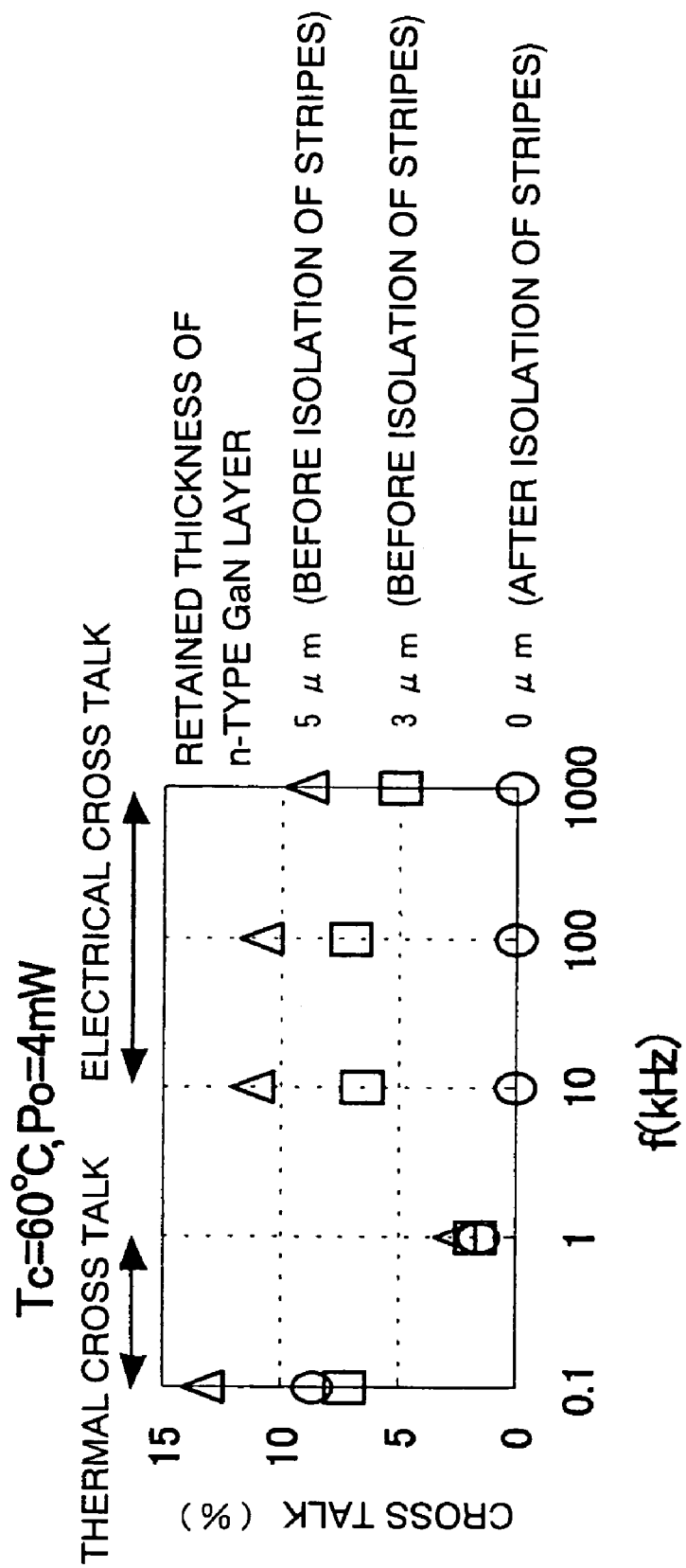

MULTIBEAM SEMICONDUCTOR LASER, SEMICONDUCTOR LIGHT-EMITTING DEVICE AND SEMICONDUCTOR DEVICE

This application claims priority to Japanese Patent Application Number JP2002-168945, filed Jun. 10, 2002 which is incorporated herein by reference.

Technical Field

This invention relates to a multi-beam semiconductor laser, semiconductor light-emitting device and semiconductor device, suitable for application to a multi-beam semiconductor laser using nitride III–V compound semiconductors for example.

BACKGROUND ART

As semiconductor lasers using nitride III–V compound semiconductors such as AlGaInN, single beam type lasers have been developed and has entered a phase of practical applications as light sources of high-density optical discs, and the like.

On the other hand, for application of a semiconductor laser using nitride III–V compound semiconductors to a light source of a laser beam printer, it is necessary to realize a multi-beam semiconductor laser in which two beams or four beams can be driven independently.

The Applicant proposed a two-beam semiconductor laser using nitride III–V compound semiconductors as shown in FIG. 1 as a multi-beam laser (Extended abstract, Japan Society of Appl. Phys., 62nd Technical Meeting, September 2001, 14p-N-9). As shown in FIG. 1, in this two-beam semiconductor laser, an n-type GaN layer 102 is grown on a c-plane sapphire substrate 101, and GaN compound semiconductor layers forming a laser structure are stacked thereon sequentially, namely, an n-type AlGaN clad layer 103, an n-type GaN optical guide layer 104, an active layer 105, a p-type GaInN intermediate layer 106, a p-type AlGaN cap layer 107, a p-type GaN optical guide layer 108, a p-type AlGaN clad layer 109 and a p-type GaN contact layer 110, to form a mesa portion as a whole. In this case, the uppermost part of the GaN compound semiconductor layers forming the laser structure, namely, the upper part of the p-type AlGaN clad layer 109 and the p-type GaN contact layer 110 are shaped into two ridges 111, 112 extending in parallel. Furthermore, an insulating film 113 covers the mesa portion. The insulating film 113 has openings 113a, 113b above the ridges 111, 112, and p-side electrodes (anode electrodes) 114, 115 are formed in contact with the p-type GaN contact layer 110 through the openings 113a, 113b. Furthermore, a p-side electrode (anode electrode) 116 covers the p-side electrodes 114, 115 and the insulating film 113. The part of the insulating film 113 in contact with the mesa structure has openings 113c, 113d, and n-side electrodes (cathode electrodes) 117, 118 are formed in contact with the n-type GaN layer 102 through the openings 113c, 113d.

However, the two-beam semiconductor laser shown in FIG. 1 cannot drive individual laser structures independently, and it cannot be directly used as the light source of a laser beam sprinter.

On the other hand, Japanese Laid-Open Publication No. 2000-269601 proposes a multi-beam semiconductor laser although it used semiconductors other than nitride III–V compound semiconductors. However, it is difficult to employ the structure disclosed in this publication cannot directly in semiconductor lasers using nitride III–V compound semiconductors because sapphire substrates exclusively used therein as their substrates are electrically insulating and both the p-side electrodes and n-side electrodes must be lead out from one side of the substrate.

It is therefore an object of the invention to provide a multi-beam semiconductor laser using nitride III–V compound semiconductors, which can drive its individual laser structures independently and can be easily examined in operations before packaging.

It is a more general object of the invention to provide a multi-beam semiconductor laser using nitride III–V compound semiconductors or other semiconductor materials, which can drive its individual laser structures and can be easily examined in operations before packaging.

It is a yet more general object of the invention to provide an integrated semiconductor light-emitting device and a semiconductor device using nitride III–V compound semiconductors or other semiconductor materials, which can drive its individual laser structures and can be easily examined in operations before packaging.

DISCLOSURE OF INVENTION

To accomplish the above objects, the first aspect of the invention is a multi-beam semiconductor laser including nitride III–V compound semiconductor layers formed on one major surface of a substrate to form a laser structures, and including an anode electrode and a cathode electrode formed on the nitride III–V compound semiconductor layers, comprising:

at least one of the anode electrode and the cathode electrode being formed to bridge over the other of the anode electrode and the cathode electrode in an electrically insulated condition.

The anode electrode and the cathode electrode also contemplate pad electrodes for electrical connection to an external circuit. To establish the electrically insulated condition, a so-called air-bridge structure is employable. Typically, however, at least one of the anode electrode and the cathode electrode is formed to bridge over the other via tan insulating film. In this case, at least a part of at least one of the anode electrode and the cathode electrode and at least a part of the other of the anode electrode and the cathode electrode are typically exposed externally. Most typically, the anode electrode is formed to bridge over the cathode electrode via an insulating film, and a part of the anode electrode and at least a part of the cathode electrode are exposed externally.

Furthermore, an upper part of the substrate is typically formed by horizontal growth of a nitride III–V compound semiconductor having periodical low-defect regions, which is typically GaN, and light emitting portions (that can be reworded as laser stripes or ridges) are formed on the low-defect regions. When the laser chip is mounted, the nitride III–V compound semiconductor layers formed by epitaxial growth are most typically oriented downward in form of the epi-side down. However, it is also acceptable to orient the nitride III–V compound semiconductors in form of the epi-side up.

To reduce electrical and thermal cross talk between the individual light emitting portions (laser structures) that emit laser beams (influences of a laser beam emitted from one laser structure to laser beams emitted from the other laser structures during operations of the laser structures) and to thereby prevent fluctuations of laser beams, or to enable the use of the multi-beam semiconductor laser both in the anode-common and in the cathode-common modes, the respective light emitting portions are preferably isolated. More specifically, the respective light emitting portions are preferably isolated from each other by grooves and/or insulating elements.

The nitride III–V compound semiconductors are most generally such materials as expressed by $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$ $0 \leq x+y+z<1$ and $0 \leq u+v<1$), more specifically such materials as expressed $Al_xB_yGa_{1-x-z}In_zN$ (where $0 \leq x \leq 1$, $0 \leq y \leq 1$, $0 \leq z \leq 1$, and $0 \leq x+y+z<1$), or typically such materials as expressed by $Al_xGa_{1-x-z}In_zN$ (where $0 \leq x \leq 1$ and $0 \leq z \leq 1$). Concrete examples of such nitride III–V compound semiconductors are GaN, InN, AlN, AlGaN, InGaN, AlGaInN, and the like.

The second aspect of the invention is a multi-beam semiconductor laser including semiconductor layers formed on one major surface of a substrate to form a laser structure, and including an anode electrode and a cathode electrode formed on the semiconductor layers, comprising:

at least one of the anode electrode and the cathode electrode being formed to bridge over the other of the anode electrode and the cathode electrode in an electrically insulated condition.

The third aspect of the invention is a semiconductor light emitting device including semiconductor layers formed on one major surface of a substrate to form a light emitting structure, and including an anode electrode and a cathode electrode on the semiconductor layers, comprising:

at least one of the anode electrode and the cathode electrode being formed to bridge over the other of the anode electrode and the cathode electrode in an electrically insulated condition.

The fourth aspect of the invention is a semiconductor device including semiconductor layers formed on one major surface of a substrate to form a device structure, and including a first electrode and a second electrode on the semiconductor layers, comprising:

at least one of the first electrode and the second electrode being formed to bridge over the other of the first electrode and the second electrode in an electrically insulated condition.

In the second to fourth aspects of the invention, the semiconductor layers may basically be any type of semiconductor layers. For example, not limited to nitride III–V compound semiconductors, they may be layers of AlGaAs-based semiconductors, AlGaInP-based semiconductors, InGaAsP-based semiconductors, GaInNAs-based semiconductors, or II–VI compound semiconductors such as ZnSe-based semiconductors and ZnO-based semiconductors. The explanation made in conjunction with the first aspect of the invention is commonly applicable to the second to fourth aspects of the invention as far as it is congruous to their natures. The first electrode and the second electrode in the fourth aspect of the invention correspond to the anode electrode and the cathode electrode in the first aspect of the invention.

In the third and fourth aspects of the invention, the semiconductor light emitting device contemplates semiconductor lasers and light emitting diodes, and the semiconductor device contemplates not only semiconductor light emitting devices, but also photo-detecting devices, field effect transistors (FETs) such as high electron mobility transistors, and electron transport devices such as heterojunction bipolar transistors (HBTs).

In the present invention, the substrate is not limited to a sapphire substrate, but may be a GaN substrate, $ZrB_2$ substrate, SiC substrate, Si substrate, GaAs substrate, GaP substrate, InP substrate, spinel substrate, silicon oxide substrate or ZnO substrate for example.

For growth of nitride III–V compound semiconductor layers or other semiconductor layers, metal-organic chemical vapor deposition (MOCVD), hydride vapor phase epitaxial growth, halide vapor phase epitaxial growth (HVPE), or the like, can be used. Additionally, molecular beam epitaxy (MBE) is also usable.

The fifth aspect of the invention is a multi-beam semiconductor laser monolithically formed on an insulating substrate, comprising:

individual devices being electrically insulated.

In the fifth aspect of the invention, the explanation made in conjunction with the first aspect of the invention is commonly applicable as far as the explanation is congruous to its nature.

According to the invention having the above-summarized features, devices can be examined in operation after growing nitride III–V compound semiconductor layers or other semiconductor layers on a sapphire substrate or any other type of substrate for example and cleaving the substrate into bars, by bringing probes into contact with (stick the probes on) the anode electrode and the cathode electrode, or the first electrode and the second electrode. Moreover, it is possible to independently drive the laser structures, light-emitting structures or device structures in individual light-emitting portions by using the anode electrode ad the cathode electrode, or the first electrode and the second electrode.

BRIEF DESCRIPTION OF DRAWINGS

FIG. 6 is a schematic diagram showing a result of measurement of the cross-talk property of a two-beam GaN compound semiconductor laser according to the fifth embodiment of the invention;

BEST MODE FOR CARRYING OUT THE INVENTION

Explained below are embodiments of the invention with reference to the drawings.

Figure 1:
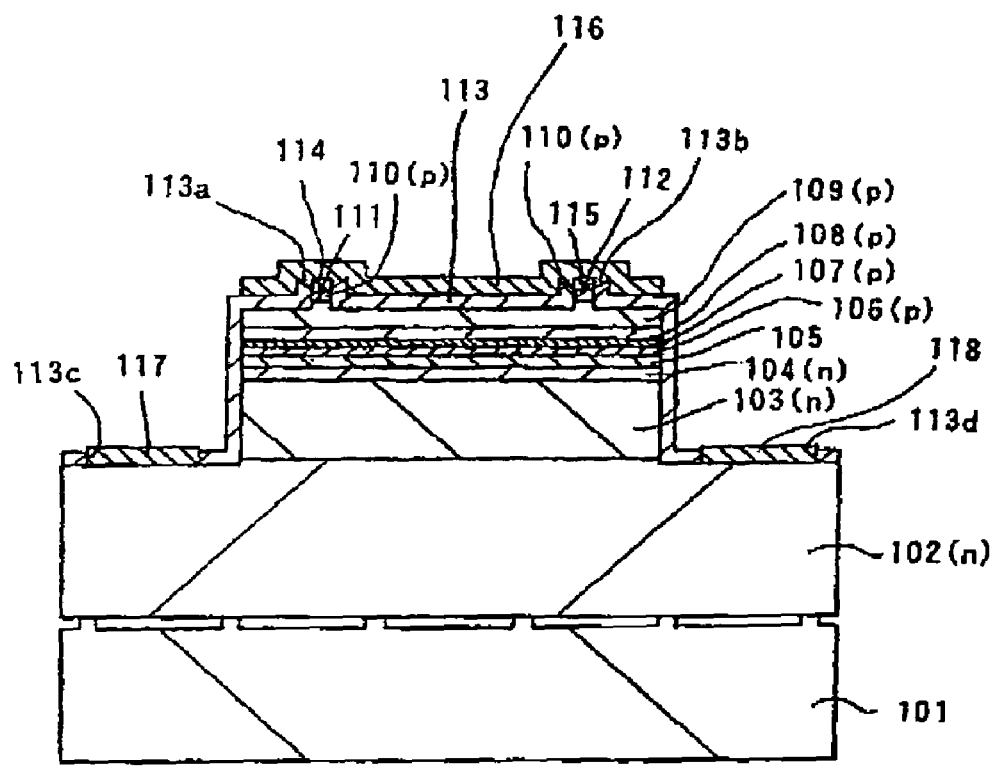
FIG. 1 is a cross-sectional view showing a conventional two-beam GaN compound semiconductor laser.
Figure 2A:
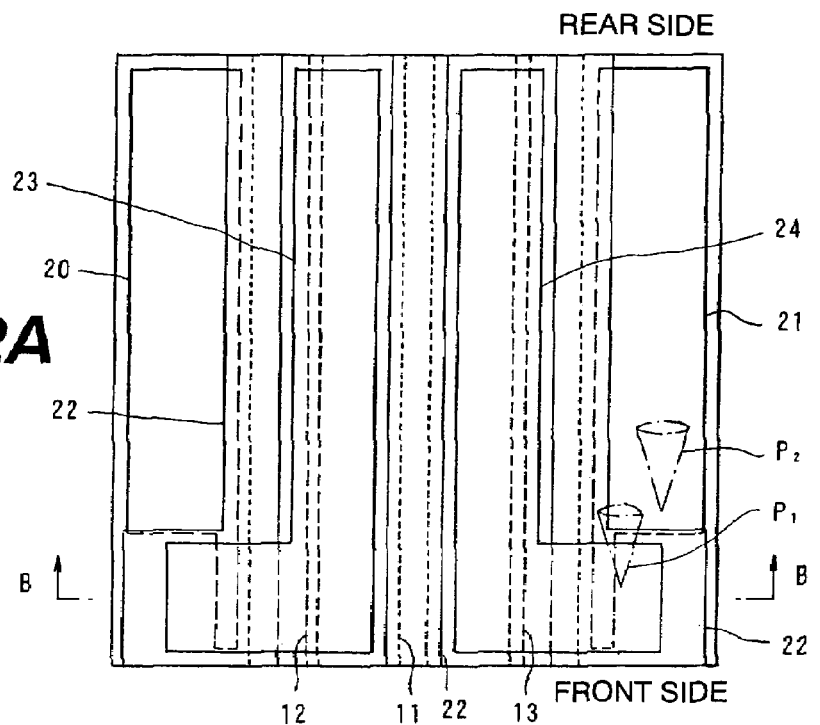
FIGS. 2A and 2B are a plan view and a cross-sectional view showing a two-beam GaN compound semiconductor laser according to the first embodiment of the invention.
Figure 2B:
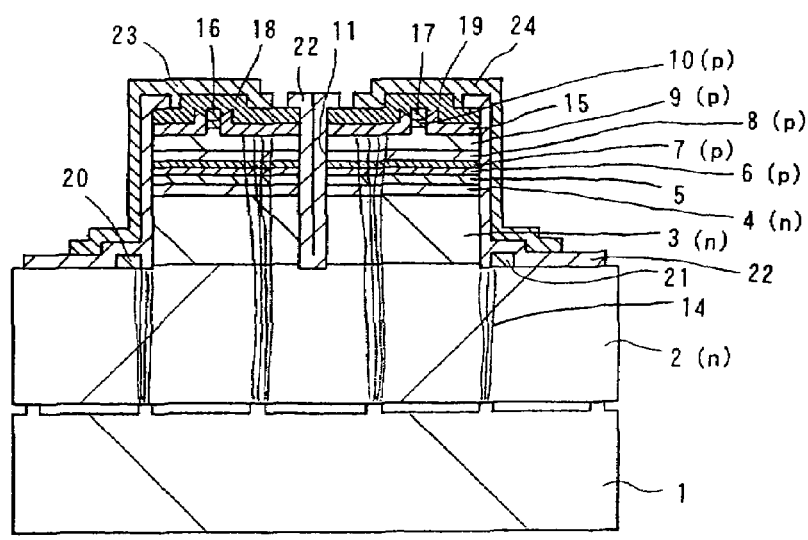

FIGS. 2A and 2B illustrate a two-beam GaN compound semiconductor laser (in form of a chip) according to the first embodiment of the invention. FIG. 2A is a plan view, and FIG. 2B s a cross-sectional view taken along the B—B line of FIG. 1A. The two-beam GaN compound semiconductor laser is a real-indexed type semiconductor laser having a ridge structure and a SCH (Separate Confinement Heterostructure).

As shown in FIGS. 2A and 2B, the two-beam GaN compound semiconductor laser includes an n-type GaN layer 2 grown by a lateral crystal growth technique such as ELO (Epitaxial Lateral Overgrowth) on a c-plane sapphire substrate 1 via an undoped GaN buffer layer (not shown) formed by low-temperature growth. GaN compound semiconductor layers forming a laser structure are deposited on the n-type GaN layer 2. More specifically, there are sequentially deposited an n-type AlGaN clad layer 3, n-type GaN optical guide layer 4, active layer 5 having an undoped $In_xGa_{1-x}N/In_yGa_{1-y}N$ multiquantum well structure, p-type GaInN intermediate layer 6, p-type AlGaN cap layer 7, p-type GaN optical guide layer 8, p-type AlGaN clad layer 9 and p-type GaN contact layer 10 as the GaN compound semiconductor layers forming the laser structure.

The undoped GaN buffer layer is 30 nm thick for example. The n-type GaN layer 2 is approximately 7 $\mu$m thick for example, and doped with silicon (Si) for example, as its n-type impurity. The n-type AlGaN clad layer 3 is 1.0 $\mu$m thick for example, and doped with Si for example as its n-type impurity. Its Al composition may be 0.07 for example. The n-type GaN optical guide layer 4 is 0.1 $\mu$m thick for example, and doped with Si for example as its n-type impurity. The active layer 5 having the undoped $In_xGa_{1-x}N/In_yGa_{1-y}N$ multiquantum well structure is composed of $In_xGa_{1-x}N$ layers as barrier layers and $In_yGa_{1-y}N$ layers as well layers, which are stacked alternately. For example, each $In_xGa_{1-x}N$ layer as the barrier layer ay be 7 nm thick, and x=0.02. Each $In_yGa_{1-y}N$ layer as the well layer may be 3.5 nm thick, and y=0.14. The active layer 8 includes three well layers.

The p-type GaInN intermediate layer 6 is 20 nm thick for example, and doped with Mg for example as its p-type impurity. Its In composition may be 0.02. The p-type AlGaN cap layer 7 is 20 nm thick for example, and doped with Mg for example as its p-type impurity. Its Al composition may be 0.18. The p-type AlGaN cap layer 7 is used not only to prevent deterioration of the active layer 5 by elimination of In during growth of the p-type GaN optical guide layer 8, p-type AlGaN clad layer 9 and p-type GaN contact layer 10 but also to prevent overflow of electrons from the active layer 5.

The p-type GaN optical guide layer 8 is 0.1 $\mu$m thick for example, and doped with Mg for example as its p-type impurity. The p-type AlGaN clad layer is 0.5 $\mu$m thick for example, and doped with Mg for example as its p-type impurity. Its Al composition may be 0.18. The p-type GaN contact layer 10 is 0.1 $\mu$m thick for example, and doped with Mg for example as its p-type impurity.

The upper part of the n-type GaN layer 2, n-type AlGaN clad layer 3, n-type GaN optical guide layer 4, active layer 5, p-type GaInN intermediate layer 6, p-type AlGaN cap layer 7, p-type GaN optical guide layer 8 and p-type AlGaN clad layer 9 are shaped to form two adjacent mesa portions, and these mesa portion are isolated from each other by a groove 11 deep enough to reach the n-type GaN layer 2. In these mesa portions, the upper part of the p-type AlGaN clad layer 9 and the p-type GaN contact layer 10 are shaped into ridges 12, 13 extending in the <1-100 >direction for example. These ridges 12, 13 may be 1.7 $\mu$m wide for example. These ridges 12, 13, i.e. laser stripe portions, are each positioned in a low-defect region between dislocations 14 having propagated from seed crystals used in lateral growth to upper layers. Distance between ridges 12, 13 is preferably adjusted to a multiple of the period of the low-defect regions. That is, if the period of the low-defect regions is 16 $\mu$m for example, the distance is adjusted to 96 $\mu$m that is a multiple of the period (FIG. 2B does not show this feature for convenience of illustration).

Each mesa portion is covered by a complex film 15 composed of a 40 nm thick $SiO_2$ or other insulating film and an overlying 45 nm thick Si film, for example. The insulating film is used for electrical insulation and surface protection. The ridges 12, 13 as narrow as 1.7 $\mu$m exhibit strong lateral confinement of light, and are liable to cause a kink phenomenon, although they are preferable for reducing the aspect ratio of laser light. Therefore, the Si film is used for enhancing the absorption coefficient of the primary mode of laser light, which may cause the kink phenomenon in the sidewall portions of the ridges 12, 13, and thereby preventing the kink phenomenon. The complex film 15 have openings in regions above the ridges 12, 13, and p-side electrodes 16, 17 are brought into contact with the p-type GaN contact layer 10 of the respective mesa portions through the openings. These p-side electrodes 16, 17 have a multi-layered structure sequentially stacking a Pd film and a Pt film for example. Further, p-side electrodes 18, 19 are formed to cover the complex film 15 and the p-side electrodes 16, 17. These p-side electrodes 18, 19 have a multi-layered structure sequentially stacking a Ti film, Pt film and Ni film for example.

On the other hand, n-side electrodes 20, 21 are in contact on predetermined portions of the n-type GaN layer 2 adjacent to the mesa portions. These n-side electrodes 20, 21 have a multi-layered structure sequentially stacking a Ti film, Pt film and Au film for example. Reference numeral 22 denotes an insulating film such as a $SiO_2$ film for example. The insulating film 22 is formed to cover the sidewalls of the mesa portions and local areas of the n-side electrodes 20, 21. Furthermore, p-side pad electrodes 23, 24 are formed in contact with the p-side electrodes 18, 19 respectively. These p-side pad electrodes 23, 24 are composed of portions extending along the ridges 12, 13 and portions across them, and the latter portions bridge over end portions of the n-side electrodes 20, 21 via the insulating film 22.

In the GaN compound semiconductor laser, the cavity length L is around 600 $\mu$m for example, and the chip width across the cavity length is around 400 $\mu$m for example.

Next explained is a method of manufacturing the two-beam GaN compound semiconductor laser according to the first embodiment.

After an undoped GaN buffer layer is grown by MOCVD at 500° C. approximately on the c-plane sapphire substrate 1 whose top surface is cleaned by thermal cleaning beforehand, the n-type GaN layer 2 is grown by lateral crystal growth such as ELO at the growth temperature of 1000° C. for example.

Subsequently, GaN compound semiconductor layers forming the laser structure are sequentially grown on the n-type GaN layer 2 by MOCVD, which are the n-type AlGaN clad layer 3, n-type GaN optical guide layer 4, active layer 5 having an undoped $Ga_{1-x}In_xN/Ga_{1-y}In_yN$ multiquantum well structure, p-type GaInN intermediate layer 6, p-type AlGaN cap layer 7, p-type GaN optical guide layer 8, p-type AlGaN clad layer 9 and p-type GaN contact layer 10. The growth temperature of these layers is controlled, for example, at 1000° C. for the n-type AlGaN clad layer 3 and the n-type GaN optical guide layer 4; at 780° C. for the active layer 5 through the p-type GaN contact layer 8; and at 1000° C. for the p-type AlGaN clad layer 9 and p-type GaN contact layer 10.

As source materials of these GaN compound semiconductor layers, here are used, for example, trimethyl gallium (($CH_3)_3Ga$, TMG) as the source material of Ga, trimethyl aluminum (($CH_3)_3Al$, TMA) as the source material of Al, trimethyl indium (($CH_3)_3In$, TMI) as the source material of In, and $NH_3$ as the source material of N. As dopants, here are used, for example, silane ($SiH_4$) as the n-type dopant, and bis-methyl cyclopenthadienile magnesium (($CH_3C_5H_4)_2$Mg) or bis-cyclopenthadienile magnesium (($C_5H_5)_2Mg$).

As carrier gas atmospheres for growth of these GaN compound semiconductor layers, here are used a mixed gas of $N_2$ and $H_2$ for the n-type GaN layer 2 through the n-type GaN optical guide layer 4; a $N_2$ gas atmosphere for the active layer 5 through the p-type AlGaN cap layer 7; and a mixed gas of $N_2$ and $H_2$ for the p-type GaN optical guide layer 8 to the p-type GaN contact layer 10. In this case, since the $N_2$ atmosphere is used as the carrier gas atmosphere for growth of the layers up to the p-type AlGaN cap layer 7 after growth of the active layer 5, and the carrier gas atmosphere does not contain $H_2$, elimination of In from the active layer and its deterioration thereby can be prevented. In addition, since the mixed gas atmosphere containing $N_2$ and $H_2$ is used as the carrier gas atmosphere for growth of the p-type GaN optical guide layer 8 through the p-type GaN contact layer 10, these p-type layers can be grown to have good crystalline properties.

In the next process, the c-plane sapphire substrate 1 having those GaN compound semiconductor layers grown thereon as explained above is removed from the MOCVD apparatus. Then, after a $SiO_2$ film, for example, is formed on the entire substrate surface, the $SiO_2$ film is patterned to a predetermined configuration by etching. After a Pd film and a Pt film, for example, are sequentially formed on the entire substrate surface, the patterned $SiO_2$ film is removed together with overlying parts of the Pd film and the Pt film by lift-off to form the p-side electrodes 16, 17. Thereafter, using the p-side electrode 16, 17 as a mask, the layers are selectively etched by reactive ion etching (RIE) to a predetermined depth in the thickness direction of the p-type AlGaN clad layer 9 to form the ridges 12, 13.

Subsequently, the complex film 15 is formed by sequentially stacking an insulating film like a $SiO_2$ film and a Si film on the entire substrate surface. The complex film 15 is next removed locally from above the ridges 12, 13 to form openings. Thereafter a Ti film, Pt film and Ni film, for example, are sequentially deposited, and a resist pattern of a predetermined configuration is formed thereon by lithography. After that, using this resist pattern as a mask, these Ti film, Pt film and Ni film are selectively etched by RIE to form the p-side electrodes 18, 19. Further, using the p-side electrodes 18, 19 as a mask, the layers are etched by RIE for example to the depth reaching the n-type GaN layer 2. As a result of this etching, the upper part of the n-type GaN layer 2, n-type AlGaN clad layer 3, n-type GaN optical guide layer 4, active layer 5, p-type GaInN intermediate layer 6, p-type AlGaN cap layer 7, p-type GaN optical guide layer 8, p-type AlGaN clad layer 9 and p-type GaN contact layer 10 are patterned into two adjacent mesa structures, and the groove 11 isolating these mesa portions is formed simultaneously.

In the next process, after a resist pattern of a predetermined geometry is formed on the substrate surface by lithography, a Ti film, Pt film and Au film, for example, are sequentially deposited on the entire substrate surface. Thereafter, the resist pattern is removed together with overlying Ti film, Pt film and Au film by lift-off to form the n-side electrodes 20, 21. After that, the $SiO_2$ or other insulating film 22 is formed on the entire substrate surface, and a resist pattern of a predetermined geometry is formed thereon by lithography. Next using the resist pattern as a mask, the insulating film 22 is patterned to a predetermined geometry by RIE for example.

In the next process, after a resist pattern of a predetermined geometry is formed on the substrate surface by lithography, a Ti film, Pt film and Au film, for example are sequentially deposited on the entire substrate surface. The resist pattern is next removed together with the overlying Ti film Pt film and Au film by lift-off to form the p-side pad electrodes 23, 24.

After that, the c-plane sapphire GaN substrate 1 having formed the laser structures through the foregoing steps is cut into bars by cleavage to form opposite cavity edges. Further, after coating these cavity edges, each bar is divided to chips by cleavage, or the like. The reflectance is adjusted to 20% for the front-side cavity edge and 70% for the rear-side cavity edge, for example.

Through those steps, the intended two-beam GaN compound semiconductor laser is completed.

The two-beam GaN compound semiconductor laser is typically packaged on a heat sink of AlN for example in an epi-side-down (p-side-down) orientation for better heat radiation in operation. In this case, the p-side pad electrodes 23, 24 of the two-beam GaN compound semiconductor laser are fusion-bonded with a tin solder (not shown), for example, to bump electrodes formed on a predetermined wiring pattern on the top surface of the heat sink.

The first embodiment has the following advantages.

In the two-beam GaN compound semiconductor laser, the laser structure of the left mesa portion in FIGS. 2A and 2B can be driven by applying a voltage between the p-side pad electrode 23 and the n-side electrode 20 for electrical supply, and the laser structure in the right mesa portion in FIGS. 2A and 2B can be driven by applying a voltage between the p-side pad electrode 24 and the n-side electrode 21 for electrical supply. That is, these two laser structures can be driven independently.

Furthermore, in the state of a laser bar, the entirety of the p-side pad electrodes 23 and a part of the n-side electrode 20 are exposed on the outer surface, and the entirety of p-side pad electrode 24 and a part of the n-side electrode 21 are exposed on the outer surface. Therefore, as shown by the dash-and-dot line in FIG. 2A, by sticking probes $P_1$, $P_2$ into the p-side pad electrode 24 and the n-side electrode 21 in the exposed portion and applying a voltage across them, operation characteristics can be checked. Similarly, by sticking probes $P_1$, $P_2$ into the p-side pad electrode 24 and the n-side electrode 21 in the exposed portion and applying a voltage across them, operation characteristics can be checked. The capability of the bar check means the capability of operation check or evaluation of the property before assemblage. Therefore, two-beam GaN compound semiconductor lasers having acceptable properties can be selected and assembled to improve the production yield of devices using lasers.

In addition, since the p-side pad electrodes 23, 24 and the n-side electrodes 20, 21 are usable as wire bonding pads, the laser copes with both epi-side-down assemblage and epi-side-up assemblage. That is, the laser is available for wider modes of assemblage.

Moreover, the two-beam GaN compound semiconductor laser has no double wiring structure on the laser stripes that will generate heat during operation. Therefore, the embodiment can realize a two-beam GaN compound semiconductor laser without degrading the reliability.

Furthermore, since the two-beam GaN compound semiconductor laser employs a multi-layered wiring structure, distance between the ridges 12, 13, i.e. the beam distance, can be narrowed easily.

In addition, since the groove 11 isolating the individual laser structures in the two-beam GaN compound semiconductor laser is covered by the insulating film 22, the laser is free from undesirable creepage of Sn solder (not shown) along the sidewalls of the mesa portions up to n-side layers in the process of welding the two-beam GaN compound semiconductor laser on a heat sink and therefore free from undesirable short-circuiting between the anode and the cathode by the solder.

Next explained is a two-beam GaN compound semiconductor laser according to the second embodiment of the invention.

Figure 3:
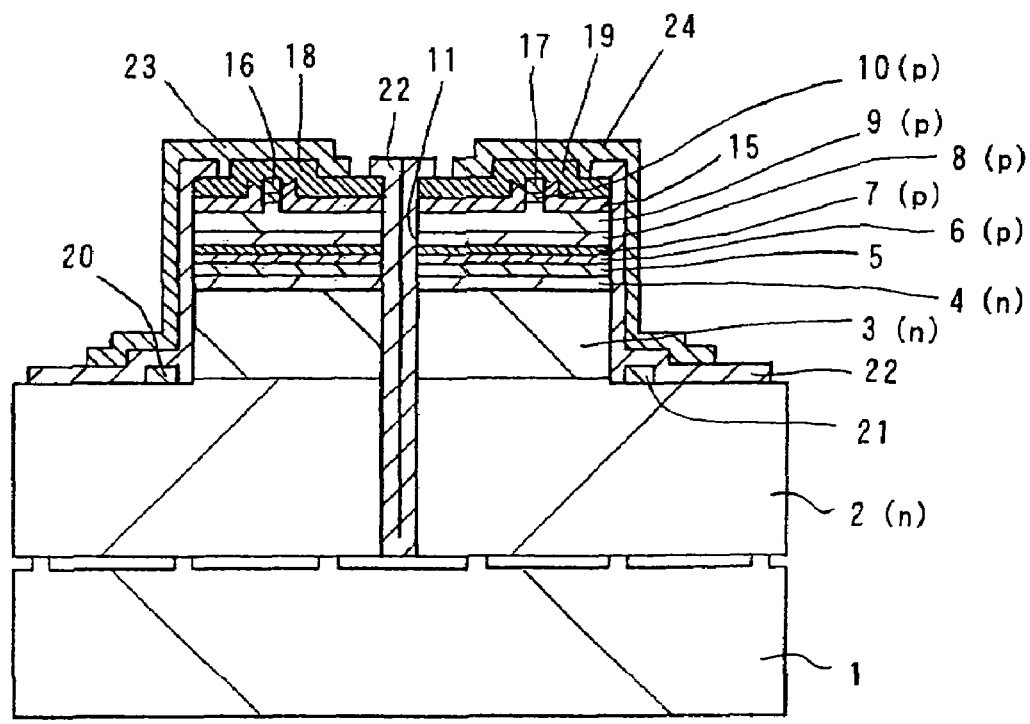
FIG. 3 is a cross-sectional view showing a two-beam GaN compound semiconductor laser according to the second embodiment of the invention.

FIG. 3 is a cross-sectional view, similar to FIG. 2B, of the two-beam GaN compound semiconductor laser. The two-beam GaN compound semiconductor laser appears identically in its plan view.

As shown in FIG. 3, in the two-beam GaN compound semiconductor laser, the groove 11 for isolating two laser structures pass through the n-type GaN layer 2, and an insulating film 22 is formed to bury the groove.

The other features of this two-beam GaN compound semiconductor laser are identical to those of the first embodiment. So, their detailed explanation is omitted.

The second embodiment has the same advantages as those of the first embodiment, and additional advantages explained below. That is, since the groove 11 extends through the n-type GaN layer 2, there is no electrically conductive semiconductor layer connecting two laser structures exists. Therefore, two laser structures are completely isolated electrically. Thus, the two laser structures can be driven completely independently to operate the laser structure on the left in FIG. 3 by applying a voltage between the p-side pad electrode 23 and the n-side electrode 20 and to drive operate the laser structure on the left in FIG. 3 by applying a voltage between the p-side pad electrode 24 and the n-side electrode 21.

Furthermore, since the p-side pad electrodes 23, 24 are completely independent from each other, and the n-side electrodes 20, 21 are also completely independent from each other, it is possible to drive the individual laser structures independently from each other whichever of the anode and the cathode is common, i.e., in any of the anode-common structure or cathode-common structure. Therefore, any of the anode-common and the cathode-common structure can be selected freely, and the embodiment needs no change in device structure for different drive circuits.

Next explained is a four-beam GaN compound semiconductor laser according to the third embodiment of the invention.

Figure 4A:
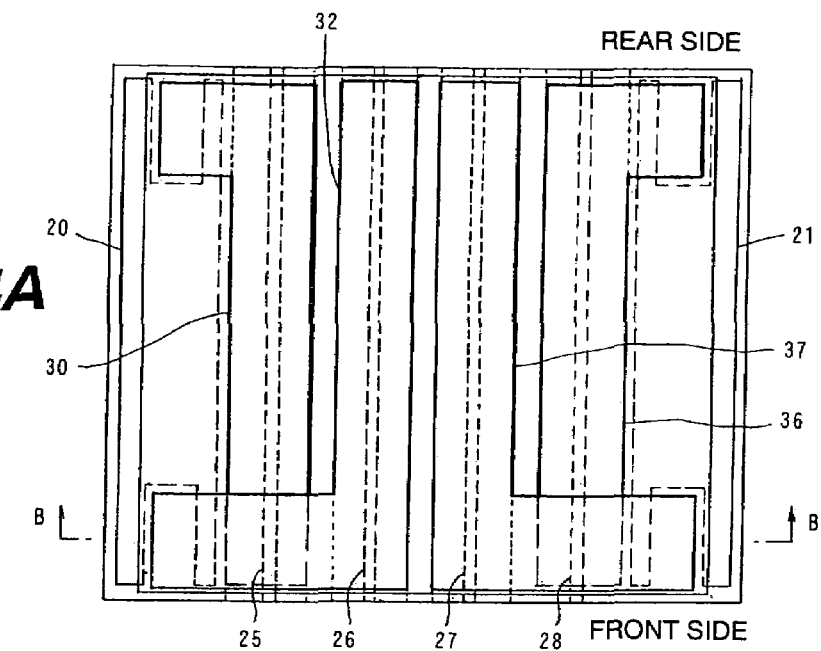
FIGS. 4A and 4B are a plan view and a cross-sectional view showing a four-beam GaN compound semiconductor laser according to the third embodiment of the invention.
Figure 4B:
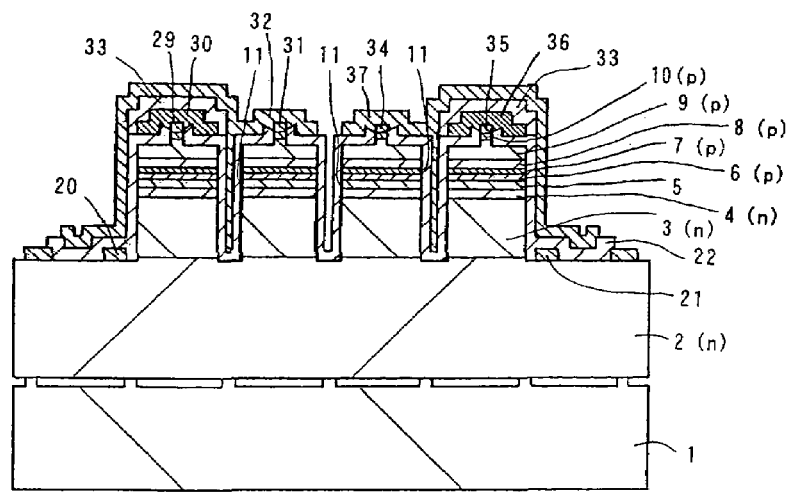

FIGS. 4A and 4B show the four-beam GaN compound semiconductor laser (still in form of a chip). FIG. 4A is a plan view, and FIG. 4B is a cross-sectional view taken along the B—B line of FIG. 4A.

As shown in FIGS. 4A and 4B, the four-beam GaN compound semiconductor laser includes four isolated laser structures in correspondence to four beams. In the following explanation, these four laser structures are numbered first to fourth in order from the left end one in FIGS. 4A and 4B. Reference numerals 25 through 28 denote ridges of these four laser structures. Distance between every adjacent two of the ridges 25 through 28 is 16 μm for example.

In the first laser structure, a p-side electrode 29 comprising a Pd film and a Pt film, for example, stacked sequentially is formed in contact with the p-type GaN contact layer 10 of the ridge 25. Further formed thereon is a p-side electrode 30 comprising a Ti film, Pt film and Au film, for example, stacked sequentially and commonly used as a pad electrode. The p-side electrode 30 is composed of a portion extending along the ridge 25 and a portion intersecting at a right angle with the ridge 25, and the latter portion rides over one end of the n-side electrode 20 via the insulating film 22.

In the second laser structure, a p-side electrode 31 comprising a Pd film and a Pt film, for example, stacked sequentially is formed in contact with the p-type GaN contact layer 10 of the ridge 26. Further formed thereon is a p-side electrode 3 comprising a Ti film, Pt film and Au film, for example, which are stacked sequentially. The p-side electrode 32 is composed of a portion extending along the ridge 26 and a portion intersecting at a right angle with the ridge 26, and the latter portion rides over the other end of the n-side electrode 20 via the insulating film 22. The p-side pad electrode 32 is electrically insulated from the p-side electrode 30 by an insulating film 33 such as $SiO_2$ film at the portion thereof where the portion of the p-side pad electrode 32 intersecting at a right angle with the ridge intersects with the first laser structure.

The third and fourth laser structures have structures symmetrical with the first and second laser structures. More specifically, in the third laser structure, a p-side electrode 34 comprising a Pd film and a Pt film, for example, stacked sequentially is formed in contact with the p-type GaN contact layer 10 of the ridge 27. In the fourth laser structure, a p-side electrode 35 comprising a Pd film and a Pt film, for example, stacked sequentially is formed in contact with the p-type GaN contact layer 10 of the ridge 28. Further formed thereon is a p-side electrode 36 comprising a Ti film, Pt film and Au film, for example, stacked sequentially and commonly used as a pad electrode. The p-side electrode 36 is composed of a portion extending along the ridge 28 and a portion intersecting at a right angle with the ridge 28, and the latter portion rides over one end of the n-side electrode 21 via the insulating film 22. Furthermore, in the third laser structure, a p-side pad electrode 37 comprising a Ti film, Pt film and Au film, for example, stacked sequentially is formed on the p-side electrode 34. The p-side pad electrode 37 is composed of a portion extending along the ridge 27 and a portion intersecting at a right angle with the ridge 27. The latter portion rides over the other end of the n-side electrode 21 via the insulating film. The p-side pad electrode 37 is electrically insulated from the p-side electrode 36 by an insulating film 33 such as $SiO_2$ film at the portion thereof where the portion intersecting at a right angle with the ridge 27 intersects with the fourth laser structure.

The other features of the third embodiment are identical to those of the two-beam GaN semiconductor laser according to the first embodiment. So, their detailed explanation is omitted.

The third embodiment ensures various advantages similar to those of the first embodiment also in four-beam GaN compound semiconductor lasers.

More specifically, the four-beam GaN compound semiconductor laser can drive the first laser structure by applying a voltage between the p-side electrode 30 and the n-side electrode 20 for electrical supply; the second laser structure by applying a voltage between the p-side pad electrode 32 and the n-side electrode 20 for electrical supply; the third laser structure by applying a voltage between the p-side pad electrode 37 and the n-side electrode 21 for electrical supply; and the fourth laser structure by applying a voltage between the p-side electrode 36 and the n-side electrode 21 for electrical supply. That is, the four laser structures can be driven independently from each other.

In addition, in the status cut to a laser bar, a part of the p-side electrode 30, entirety of the p-side pad electrode 32, entirety of the p-side pad electrode 36, part of the p-side electrode 36, part of the n-side electrode 20 and part of the n-side electrode 21 are exposed on surfaces. Therefore, the individual laser structures can be examined in operation property by sticking probes on these electrodes. As a result, four-beam GaN compound semiconductor lasers having acceptable properties can be exclusively selected and assembled to improve the production yield of devices including these lasers.

Furthermore, the p-side electrodes 30, 36 and the p-side pad electrodes 32, 37 are usable as wire bonding pads too. Therefore, the laser can cope with any of the epi-side-down and epi-side-up assemblage, that is, it is increased in freedom of the mode of assemblage.

Moreover, the four-beam GaN compound semiconductor laser has no double wiring structure on the laser stripes that will generate heat during operation. Therefore, the embodiment can realize a four-beam GaN compound semiconductor laser without degrading the reliability.

In addition, since this four-beam GaN compound semiconductor laser employs a multi-layered wiring structure, distance between every adjacent two of the ridges 25 through 28, i.e. the beam distance, can be narrowed easily.

Furthermore, since the groove 11 isolating the individual laser structures in the four-beam GaN compound semiconductor laser is covered by the insulating film 22, the laser is free from undesirable creepage of Sn solder (not shown) along the sidewalls of the mesa portions up to n-type layers in the process of welding the two-beam GaN compound semiconductor laser on a heat sink and therefore free from undesirable short-circuiting between the anode and the cathode by the solder.

Next explained is a four-beam GaN compound semiconductor laser according to the fourth embodiment of the invention.

Figure 5A:
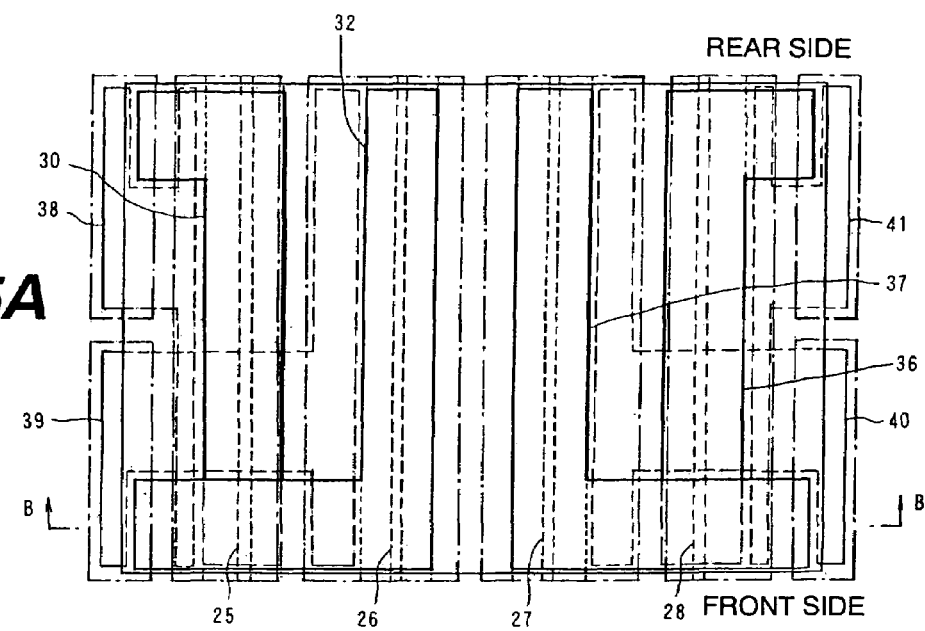
FIGS. 5A and 5B are a plan view and a cross-sectional view showing a four-beam GaN compound semiconductor laser according to the fourth embodiment of the invention.
Figure 5B:
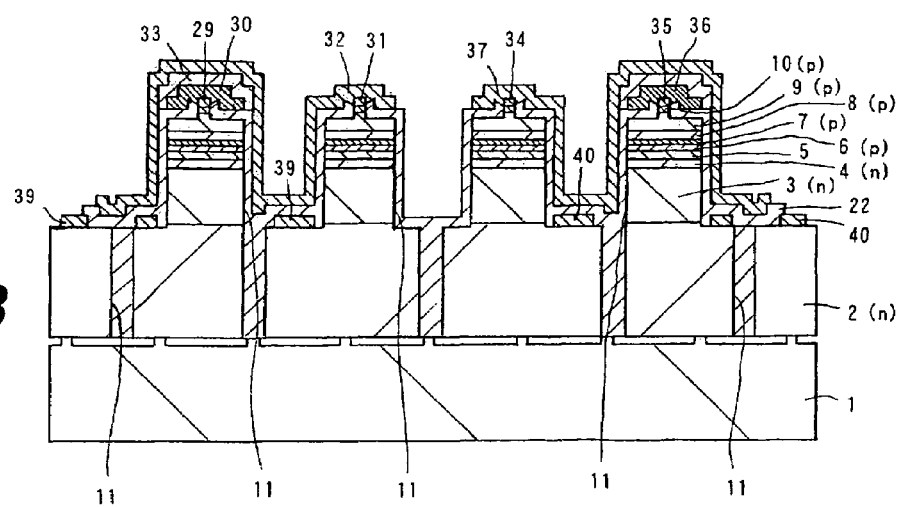

FIGS. 5A and 5B show the four-beam GaN compound semiconductor laser (still in form of a chip). FIG. 5A is a plan view, and FIG. 5B is a cross-sectional view taken along the B—B line of FIG. 5A.

As shown in FIGS. 5A and 5B, in the four-beam GaN compound semiconductor laser shown here, n-side electrodes 38 through 41 are provided independently for individual first to fourth laser structures. Further, grooves 11 are formed to penetrate the n-type GaN layer 2 so as to isolate the respective laser structures; further isolate a part of the n-type GaN layer 2 where one end of the n-side electrode 38 of the first laser structure exists from a part of the n-type GaN layer 2 where one end of the n-side electrode 39 of the second laser structure; and similarly isolate a part of the n-type GaN layer 2 where one end of the n-side electrode 40 of the third laser structure exists from a part of the n-type GaN layer 2 where one end of the n-side electrode 41 of the fourth laser structure exists.

The other features of the fourth embodiment are identical to those of the four-beam GaN compound semiconductor laser according to the third embodiment. So, their detailed explanation is omitted.

The fourth embodiment ensures the same advantages as those of the third embodiment, and the following additional advantages. That is, since the grooves 11 formed to penetrate the n-type GaN layer 2 isolate the individual laser structures and isolate end portions of the n-side electrodes 38 through 41 from each other, there is no electrically conductive semiconductor layer connecting the four laser structures, and the individual laser structures are completely isolated electrically. Therefore, the four laser structures can be driven completely independently from each other without no electrical cross talk among them to operate the first laser structure by applying a voltage between the p-side electrode 30 and the n-side electrode 38; the second laser structure by applying a voltage between the p-side pad electrode 32 and the n-side electrode 39; the third laser structure by applying a voltage between the p-side pad electrode 37 and the n-side electrode 40; and the fourth laser structure by applying a voltage between the p-side electrode 35 and the n-side electrode 41.

Moreover, since the p-side electrodes 30, 36 and the p-side pad electrodes 32, 37 are completely independent, and the n-side electrodes 38 through 41 are also completely independent from each other, it is possible to drive the individual laser structures independently from each other whichever of the anode and the cathode is common, i.e., in any of the anode-common structure and cathode-common structure. Therefore, any of the anode-common and the cathode-common structure can be selected freely, and the embodiment needs no change in device structure for different drive circuits.

Next explained is a two-beam GaN compound semiconductor laser according to the fifth embodiment of the invention.

In the fifth embodiment, a review is made on the relation between the depth of the groove 11 isolating the individual laser structures, in other words, the thickness of the n-type GaN layer 2 retained at the portion of the groove 11 (retained thickness) and the cross talk property between the laser structures. Here is assumed that the grown thickness of the n-type GaN layer 2 is 7 $\mu$m.

Figure 7:
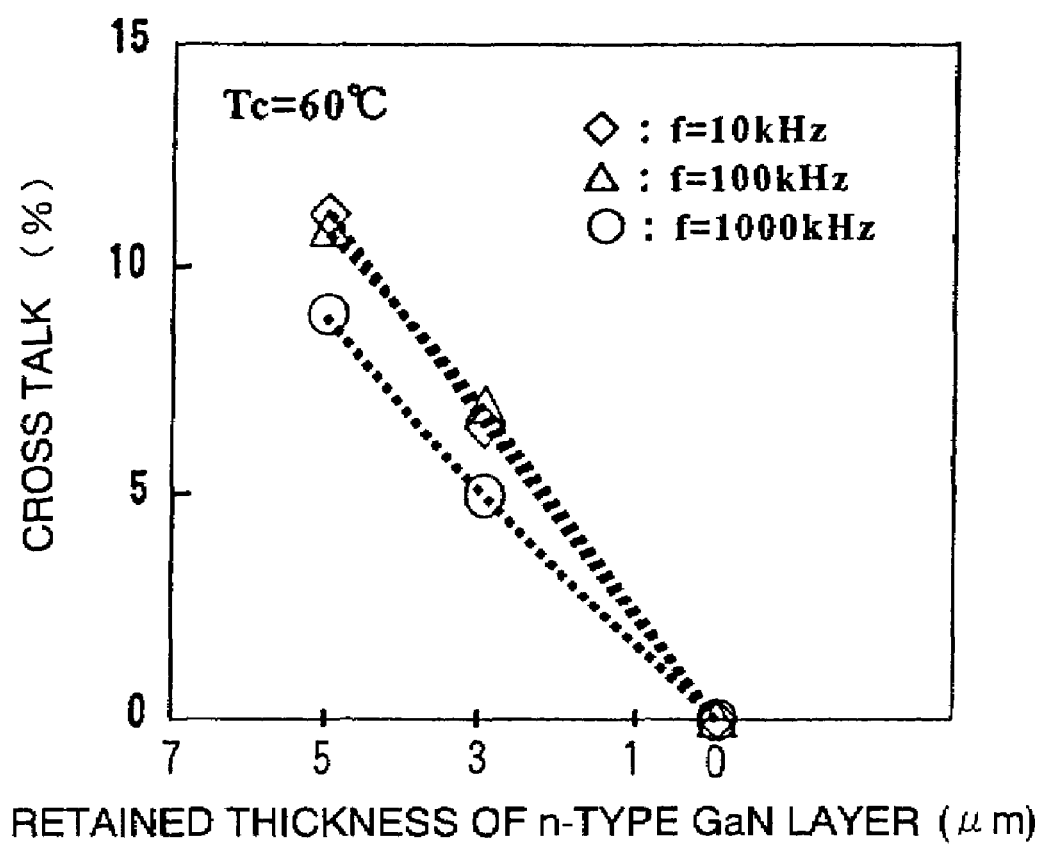
FIG. 7 is a schematic diagram showing a result of measurement of the cross-talk property of a two-beam GaN compound semiconductor laser according to the fifth embodiment of the invention.

FIG. 6 shows a result of measurement of the cross talk by changing the retained thickness of the n-type GaN layer 2 at the portion of the groove 11. The measurement was conducted by operating the laser structures in a continuously oscillated mode under the condition where the environment temperature is $T_e=60°$ C. and the optical output is $P_0=4$ mW and by changing the pulse drive frequency f. FIG. 7 shows the result of the measurement, putting the retained thickness of the n-type GaN layer at the portion of the groove 11 along the horizontal axis.

As appreciated from FIGS. 6 and 7, as the retained thickness of the n-type GaN layer 2 at the portion of the groove 11 decreases, the electrical cross talk decreases. When the retained thickness decreases to 0 $\mu$m, that is, when the groove 11 penetrates the n-type GaN layer 2, the electrical cross talk becomes 0. However, when the retained thickness is in the range equal to or less than 3 $\mu$m, the electrical cross talk is limited as small as 5 to 7%, which is a practical level. The thermal cross talk exhibits substantially the same tendency.

In view of this result, it is most preferable that the groove 11 penetrates the n-type GaN layer from the standpoint of improving the cross talk property. The two-beam GaN compound semiconductor laser according to the second embodiment is the example of the most preferable configuration of the groove 11.

In the fifth embodiment, a consideration is made about optimization of the width W of the groove, i.e. the distance between the laser structures, and packing the groove 11 with an insulator, in addition to the feature that the groove 11 penetrates the n-type GaN layer 2.

Figure 8:
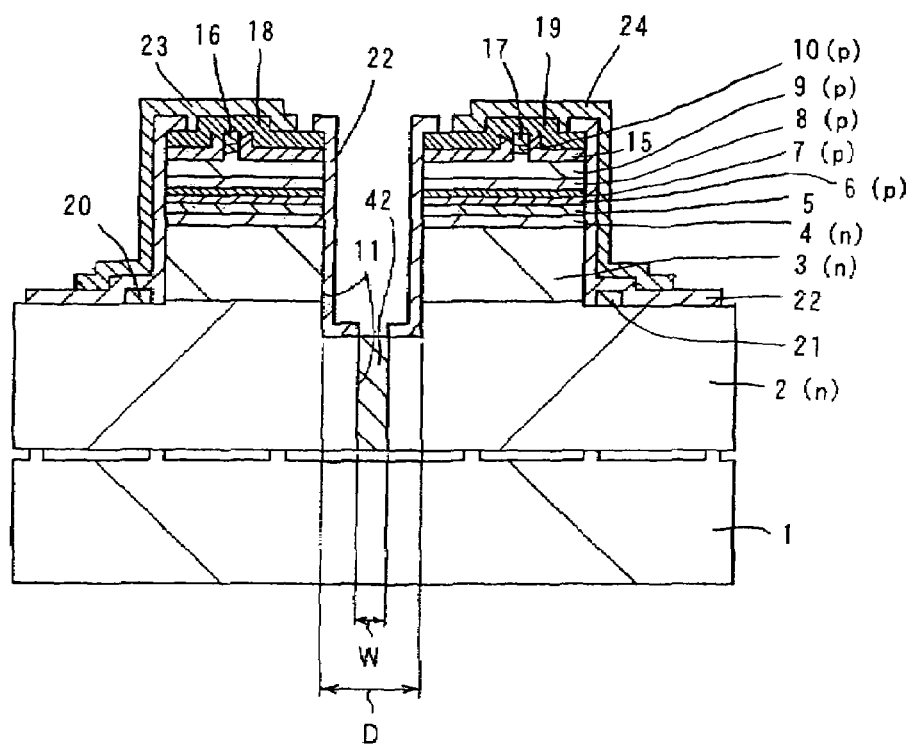
FIG. 8 is a cross-sectional view showing a two-beam GaN compound semiconductor laser according to the fifth embodiment.

FIG. 8 shows a two-beam GaN compound semiconductor laser according to the fifth embodiment.

As shown in FIG. 8, in this two-beam GaN compound semiconductor laser, the groove 11 isolating two laser structures is formed to penetrate the n-type GaN layer 2. The groove 11 in the n-type GaN layer 2 buries with an insulating film 42 such as $SiO_2$ film. In this case, distance between the ridges 12, 13, i.e. distance between beams, is 96 $\mu$m, for example.

Width W of the groove 11 in the n-type GaN layer 2 is preferably determined equal to or larger than 1 $\mu$m from the standpoint of minimizing the parasitic capacitance between two laser structures and minimizing the electrical cross talk. The larger the width W, the better the property. Actually, however, from the technical constraints of lateral crystalline growth used for growth of the n-type GaN layer 2 and for other reasons, the width W is more generally determined equal to or smaller than 15 $\mu$m, and typically determined in the range from 10 to 15 $\mu$m. Distance D between the laser structures is determined 20 $\mu$m, for example.

The groove 11 can be made in the n-type GaN layer 2 by forming a $SiO_2$ film for example on the entire substrate surface after the process of forming the p-side pad electrodes 23, 24 for example, then patterning the $SiO_2$ film to a predetermined geometry by lithography, and next selectively removing the n-type GaN layer 2 by dry etching such as RIE using the patterned $SiO_2$ film as a mask. After that, the groove 11 is buried by the insulating film 42 such as $SiO_2$ film.

The other features of the fifth embodiment are identical to those of the two-beam GaN compound semiconductor laser according to the first embodiment. So, their detailed explanation is omitted.

The fifth embodiment ensures the same advantages as those of the first embodiment, and some additional advantages explained below. That is, since the groove 11 isolating the two laser structures is formed to penetrate the n-type GaN layer 2, when the pulse drive frequency f is 10 to 1000 kHz, electrical cross talk is substantially 0%, and thermal cross talk is approximately 2%. Thus, the cross talk property practically acceptable as two-beam semiconductor laser for use in a laser beam printer can be obtained. This can be appreciated as significantly great improvement when considering that it has been very difficult to reduce the cross talk practically low to the level of 5% or less for example.

Further, since the inside of the groove is completely covered by the insulating films 22, 42, the laser is free from undesirable creepage of Sn solder (not shown) along the sidewalls of the mesa portions up to n-side layers in the process of welding the two-beam GaN compound semiconductor laser on a heat sink and therefore free from undesirable short-circuiting between the anode and the cathode by the solder.

Heretofore, some specific embodiments of the invention have been explained. However, the present invention is not limited to those embodiments, but rather contemplates various changes and modification based on the technical concept of the invention.

For example, numerical values, structures, shapes, materials, substrates, source materials, processes, and the like, which have been mentioned in conjunction with the above-explained embodiments, are not but mere examples, and any other appropriate numerical values, structures, shapes, materials, substrates, source materials, processes, and the like, may be selected where necessary.

More specifically, for example, the fifth embodiment has been explained above as forming the groove 11 in the n-type GaN layer 2 and burying the groove 11 with the insulator 42 such as $SiO_2$. However, a high-resistance material such as non-doped polycrystalline Si or AlGaN may be buried instead of the insulating film 42. Further, instead of forming the groove 11 in the n-type GaN layer 2 and burying it with the insulating film 42, it is possible to destruct crystals by selective ion injection of argon, for example, into the n-type GaN layer 2 at the portion of the groove 11 and thereby increasing the resistance of the portion high or changing the portion to an insulating state.

Furthermore, although the first to fifth embodiments have been explained as using a c-plane sapphire substrate, a different kind of substrate may be used where necessary.

Further, although the first to fifth embodiments have been explained as applications of the invention to SCH-structured GaN compound semiconductor lasers, the invention is also applicable to DH (Double Heterostructure)-structured GaN compound semiconductor lasers, for example, and further to devices having other various laser structures.

As described above, the invention can realize multi-beam semiconductor lasers, integrated semiconductor light emitting device or semiconductor device using nitride III–V compound semiconductors or other semiconductor materials, which can be driven independently and can be readily examined in operation before packaging.

What is claimed is:

1. A multi-beam semiconductor laser including nitride III–V compound semiconductor layers formed over one major surface of a substrate to form a laser structure, and including an anode electrode and a cathode electrode formed in connection with at least a portion of the nitride III–V compound semiconductor layers, wherein
at least one of the anode electrode and the cathode electrode being formed over the other of the anode electrode and the cathode electrode in an electrically insulated condition.

2. The multi-beam semiconductor laser according to claim 1 wherein at least one of the anode electrode and the cathode electrode is formed over the other of the anode electrode and the cathode electrode via an insulating film.

3. The multi-beam semiconductor laser according to claim 1 wherein at least a part of each of the anode electrode and the cathode electrode are exposed externally.

4. The multi-beam semiconductor laser according to claim 1 wherein the anode electrode is formed over the cathode electrode via an insulating film.

5. The multi-beam semiconductor laser according to claim 4 wherein at least a part of each of the anode electrode and the cathode electrode are exposed externally.

6. The multi-beam semiconductor laser according to claim 1 wherein an upper portion of the substrate is made of a nitride III–V compound semiconductor formed by lateral growth and having periodical low-defect regions.

7. The multi-beam semiconductor laser according to claim 6 wherein light emitting portions are formed over the low-defect region.

8. The multi-beam semiconductor laser according to claim 1, which is packaged to orient the nitride III–V compound semiconductor layers downward.

9. The multi-beam semiconductor laser according to claim 1 wherein a plurality of light emitting portions are isolated from each other.

10. The multi-beam semiconductor laser according to claim 9 wherein the individual light emitting portions are isolated by a groove.

11. The multi-beam semiconductor laser according to claim 9 wherein the individual light emitting portions are isolated by an insulator.

12. A multi-beam semiconductor laser including semiconductor layers formed over one major surface of a substrate to form a laser structure, and including an anode electrode and a cathode electrode formed over the semiconductor layers, wherein at least one of the anode electrode and the cathode electrode being formed over the other of the anode electrode and the cathode electrode in an electrically insulated condition.

13. A semiconductor light emitting device including semiconductor layers formed over one major surface of a substrate to form a light emitting structure, and including an anode electrode and a cathode electrode over the semiconductor layers, wherein at least one of the anode electrode and the cathode electrode being formed over the other of the anode electrode and the cathode electrode in an electrically insulated condition.

14. A semiconductor device including semiconductor layers funned over one major surface of a substrate to four a device structure, and including an n-type electrode and a p-type electrode over the semiconductor layers, wherein at least one of the n-type electrode and the p-type electrode being formed over the other in an electrically insulated condition.

* * * * *